(12) United States Patent
Wada

(10) Patent No.: US 9,679,866 B2
(45) Date of Patent: Jun. 13, 2017

(54) BONDING STAGE AND METHOD OF MANUFACTURING THE SAME

(71) Applicant: Shinkawa Ltd., Tokyo (JP)

(72) Inventor: Shoji Wada, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/990,199

(22) Filed: Jan. 7, 2016

(65) Prior Publication Data

US 2016/0118363 A1    Apr. 28, 2016

Related U.S. Application Data

(63) Continuation of application No. PCT/JP2014/057560, filed on Mar. 19, 2014.

(30) Foreign Application Priority Data

Jul. 10, 2013   (JP) ................. 2013-144704

(51) Int. Cl.
*H05B 1/02*     (2006.01)
*H01L 23/00*    (2006.01)
*H01L 21/67*    (2006.01)

(52) U.S. Cl.
CPC ........ *H01L 24/75* (2013.01); *H01L 21/67103* (2013.01); *H01L 2224/75251* (2013.01); *H01L 2224/75744* (2013.01); *H01L 2224/75983* (2013.01)

(58) Field of Classification Search
CPC ......... H01L 24/75; H01L 2224/752251; H01L 2224/75744; H01L 21/67103; H01L 2224/75983

USPC ................. 219/521, 520, 544, 548
See application file for complete search history.

(56) References Cited

U.S. PATENT DOCUMENTS

| | | | |
|---|---|---|---|
| 9,287,156 B2 * | 3/2016 | Moriya | H01L 21/67103 |
| 2002/0180466 A1 | 12/2002 | Hiramatsu et al. | |
| 2009/0309402 A1 * | 12/2009 | Rehfuss | B60N 2/4415 |
| | | | 297/284.9 |

(Continued)

FOREIGN PATENT DOCUMENTS

| | | |
|---|---|---|
| JP | 06-037149 A | 2/1994 |
| JP | 2000-260825 A | 9/2000 |

(Continued)

OTHER PUBLICATIONS

International Search Report dated Jun. 17, 2014, from corresponding International Application No. PCT/JP2014/057560.

(Continued)

*Primary Examiner* — Mark Paschall
(74) *Attorney, Agent, or Firm* — Katten Muchin Rosenman LLP

(57) ABSTRACT

Provided is a bonding stage including: a rigid block (10) having a plurality of projections (11) on a surface (16) of the base body, upper surfaces of the projections being flat; a flat plate (20) fixed to supporting surfaces (18) on the projections (11); a ceramic plate (30) suctioned and fixed to the flat plate (20); a plate-shaped heater (40) disposed on a side of the rigid block (10) of the flat plate (20); and coil springs (50) disposed between the heater (40) and the rigid block (10), the coil springs (50) bringing the heater (40) into close contact with a surface of the flat plate (20) on the side of the rigid block (10).

2 Claims, 4 Drawing Sheets

(56) References Cited

U.S. PATENT DOCUMENTS

| | | | | |
|---|---|---|---|---|
| 2012/0299253 A1* | 11/2012 | Kosakai | ............ | H01L 21/67103 279/128 |
| 2013/0008102 A1* | 1/2013 | Bindschedler | ........ | E04D 11/007 52/173.3 |

FOREIGN PATENT DOCUMENTS

| JP | 2006-324581 A | 11/2006 |
|---|---|---|
| JP | 2010-114102 A | 5/2010 |
| JP | 2010-114103 A | 5/2010 |

OTHER PUBLICATIONS

Written Opinion of the International Searching Authority dated Jun. 17, 2014, from corresponding International Application No. PCT/JP2014/057560.

* cited by examiner

BONDING STAGE AND METHOD OF MANUFACTURING THE SAME

TECHNICAL FIELD

The present invention relates to a structure of a bonding stage and a method of manufacturing such a bonding stage.

BACKGROUND ART

A flip chip bonding method of forming a solder film over a tip of a pillar of an electrode on a chip, flipping the chip and pressing the solder film formed over the tip of the pillar onto an electrode of a substrate, and heating and melting the solder, thereby mounting the chip on the substrate is widely used. An apparatus for mounting a chip on a substrate by flipping the chip in this manner is called a flip chip bonder.

In the flip chip bonding method, a plurality of electrodes of a chip are joined with a plurality of electrodes on a substrate at the same time. Accordingly, it is important to maintain the substrate and the chip to be parallel with each other, so that surfaces of solder films formed over tips of pillars of the electrodes of the chip are brought into contact with the electrodes of the substrate at the same time. Therefore, a flip chip bonder is required to have a bonding stage whose surface is highly flat. Further, it is also required that the surface of the bonding stage is heated uniformly, as it is necessary to press the solder films formed over the tips of the large number pillars onto the electrodes of the substrate, and to uniformly heat the solder to melt at the same time. Moreover, a force required for pressing the chip onto the bonding stage during bonding increases as the size of the chip to be bonded increases, the bonding stage is required to have high rigidity at the same time.

Therefore, there is proposed a method of ensuring flatness of a bonding stage by supporting the bonding stage for suctioning and holding a substrate using three support mechanisms capable of moving the bonding stage in an up-down direction, and adjusting an inclination of a surface of the bonding stage, so that parallelism between the bonding stage and the bonding tool are maintained (e.g., PTL 1 and PTL 2).

Further, a wafer heating apparatus is used in order to heat a semiconductor wafer during processes including formation of a semiconductor thin film, etching, and printing of a resist film in semiconductor fabrication. Such a wafer heating apparatus is required to uniformly heat a wafer placed on its surface, a method in which a heater is provided under a lower surface of a ceramic plate on which a wafer is placed to uniformly heat the ceramic plate is employed (e.g., PTL 3).

CITATION LIST

Patent Literatures

PTL 1: Japanese Unexamined Patent Application Publication No. 2010-114102
PTL 2: Japanese Unexamined Patent Application Publication No. 2010-114103
PTL 3: WO 01/091166

Citation List

SUMMARY OF INVENTION

Technical Problem

However, it is difficult to heat the bonding stage uniformly using the bonding stage as described in Patent Literature 1, although it is possible to maintain flatness of the surface of the bonding stage. In contrast, it is difficult to apply the wafer heating apparatus described in Patent Literature 3 to a structure of the bonding stage, because entire rigidity is insufficient as the ceramic plate is only supported on its circumference by being fitted into a cylindrical supporting container, while it is possible to uniformly heat a wafer or the like placed on a surface.

Further, in place of the structure described in Patent Literature 3, for example, it is possible to conceive a method of providing a structure of a bonding stage configured by patterning a resistance wire over a mica plate in which a low-profile heater of substantially the same shape is inserted. However, this method has a problem that the insertion of the low-profile heater changes flatness of the surface of the bonding stage, thus failing to ensure favorable flatness.

Thus, an object of the present invention is to provide a bonding stage with a simple structure, high rigidity, high flatness, capability of uniform heating, and high maintainability.

Solution to Problem

A bonding stage according to the present invention includes: a base body having a plurality of projections on a surface of the base body, upper surfaces of the projections being flat; a flat plate fixed to the upper surfaces of the projections; a surface plate suctioned and fixed to the flat plate; a plate-shaped heater disposed on a side of the base body of the flat plate; and elastic members disposed between the heater and the base body, the elastic members bringing the heater into close contact with a surface of the flat plate on the side of the base body.

It is preferable that the bonding stage according to the present invention be configured such that the base body includes a plurality of bottomed holes, the elastic members are respectively disposed in the bottomed holes, and an initial height of the elastic members is greater than a depth of the bottomed holes, the heater includes a plurality of holes through which the projections penetrate, and is movable along the projections in a thickness direction of the base body, and the elastic members are compressed when the flat plate is fixed to the upper surfaces of the projections of the base body, and press the heater onto the flat plate to bring the heater into close contact with the flat plate.

A method of manufacturing a bonding stage according to the present invention includes: a step of preparing a base body and a flat plate, the base body having a plurality of projections on a surface of the base body, upper surfaces of the projections being flat, the flat plate being fixed to the upper surfaces of the projections; a flat plate fixation step of fixing the flat plate to the upper surfaces of the projections; a flattening step of flattening a surface of the flat plate while treating the base body and the flat plate as a single unit; a flat plate removal step of removing the flat plate from the base body after the flattening step; a heater arrangement step of arranging a plate-shaped heater and elastic members between the heater and the base body; and a flat plate re-fixation step of fix the flat plate to the base body again such that the flat plate is fixed to the upper surfaces of the projections, and that the heater is brought into close contact with the surface of the flat plate on a side of the base body.

Advantageous Effect of Invention

The present invention has an effect of providing a bonding stage with a simple structure, high rigidity, high flatness, capability of uniform heating, and high maintainability.

DESCRIPTION OF EMBODIMENTS

Figure 1:
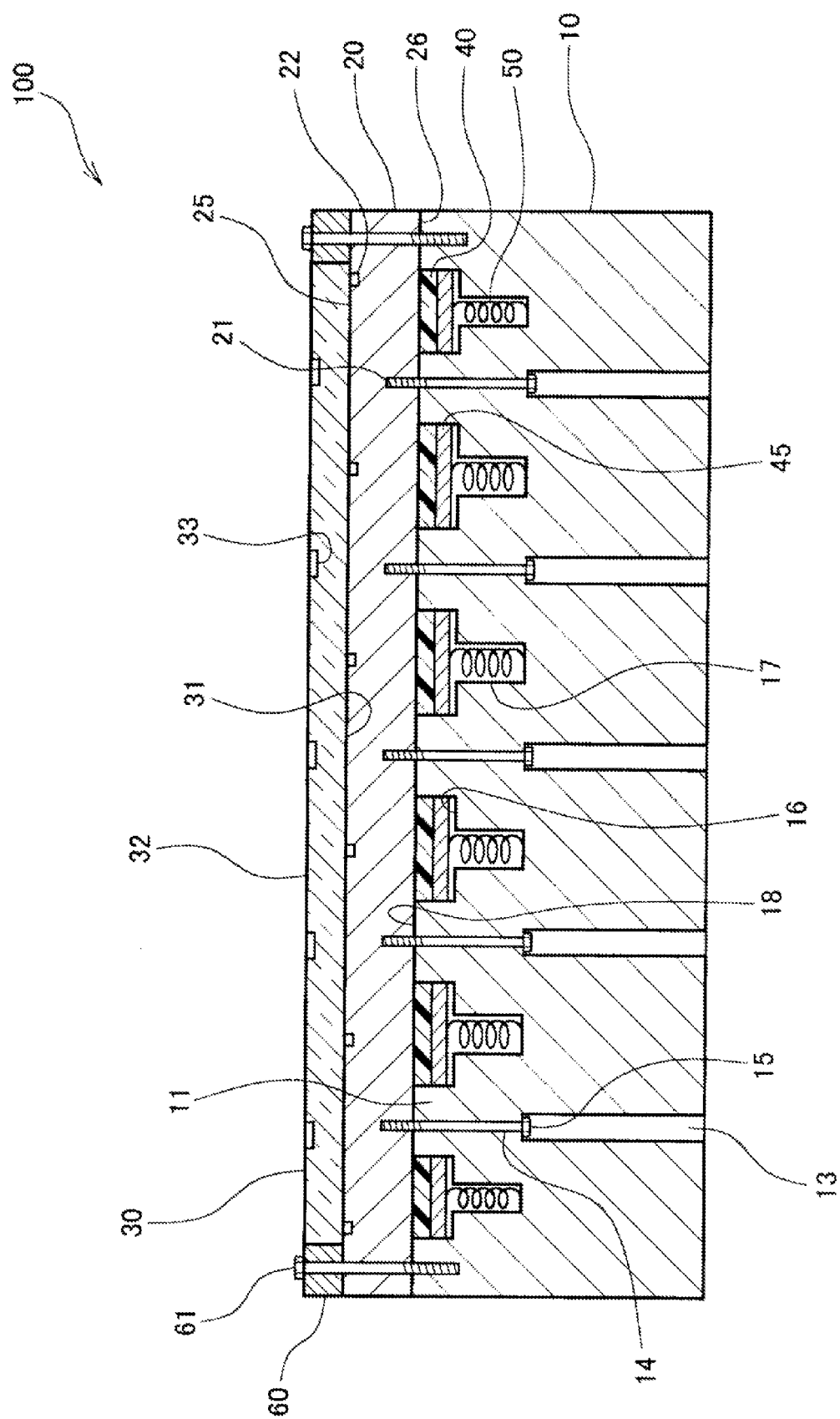
FIG. 1 is a schematic diagram illustrating a cross-section of a bonding stage according to an embodiment of the present invention.

Hereinafter, an embodiment of the present invention will be described with reference to the drawing. FIG. 1 is a schematic diagram illustrating a cross-section of a bonding stage 100 according to the present invention. A scale ratio of illustrated components is altered and not to scale for the purpose of illustration. Referring to FIG. 1, the bonding stage 100 of this embodiment is provided with: a metallic rigid block 10 as a base body; a metallic flat plate 20 attached to an upper surface of the rigid block 10; a ceramic plate 30 as a surface plate disposed over the flat plate 20; a plate-shaped heater 40 disposed on a side of the rigid block 10 of the flat plate 20; a heater retainer plate 45 provided under the heater 40 (on the side of the rigid block 10); and coil springs 50 as an elastic body disposed between the heater retainer plate 45 and the rigid block 10.

Figure 2:
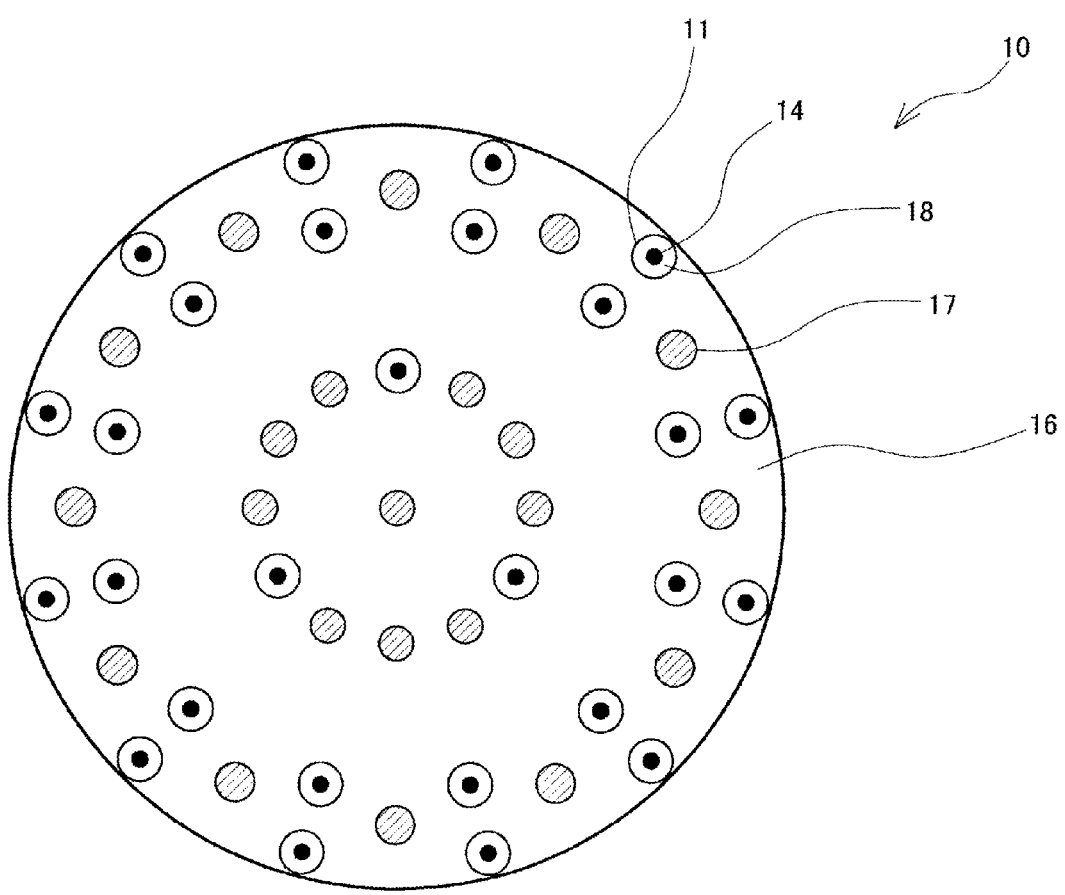
FIG. 2 is a plan view illustrating a base body of the bonding stage according to the embodiment of the present invention.

As illustrated in FIG. 2, the rigid block 10 is in a disc shape. As illustrated in FIG. 1 and FIG. 2, a plurality of projections 11 and a plurality of bottomed holes 17 (indicated by hatched circles in FIG. 2) are arranged on a planar surface 16. The projections 11 are in a circular cylindrical shape with a flat tip (upper surface), and each have a hole 14 (indicated by a black circle in FIG. 2) opening in its center. A portion around the hole 14 on the upper surface of each projection 11 constitutes an annular supporting surface 18. As illustrated in FIG. 1, in a lower surface of the rigid block 10, bottomed holes 13 are provided at positions corresponding to positions of the holes 14, and each of the holes 14 in the projections 11 penetrates to an upper end surface of the bottomed hole 13. Therefore, the holes 14 are communicated with the respective bottomed holes 13, and constitute through holes penetrating through the rigid block 10 in a thickness direction. As illustrated in FIG. 1, the supporting surfaces 18 of the projections 11 are machined to be flush with each other, so that a lower surface 26 of the flat plate 20 can be flatly supported thereon. Further, a bolt 15 for fastening the rigid block 10 with the flat plate 20 from a lower side of the rigid block 10 penetrates through each pair of the hole 14 and the bottomed hole 13. A threaded portion of a tip of the bolt 15 is screwed into a thread hole 21 defined in the flat plate 20 to fix the flat plate 20 to the rigid block 10. Moreover, as illustrated in FIG. 1, the coil springs 50 as an elastic body are respectively disposed in the bottomed holes 17 defined in the surface 16 of the rigid block 10.

Figure 3:
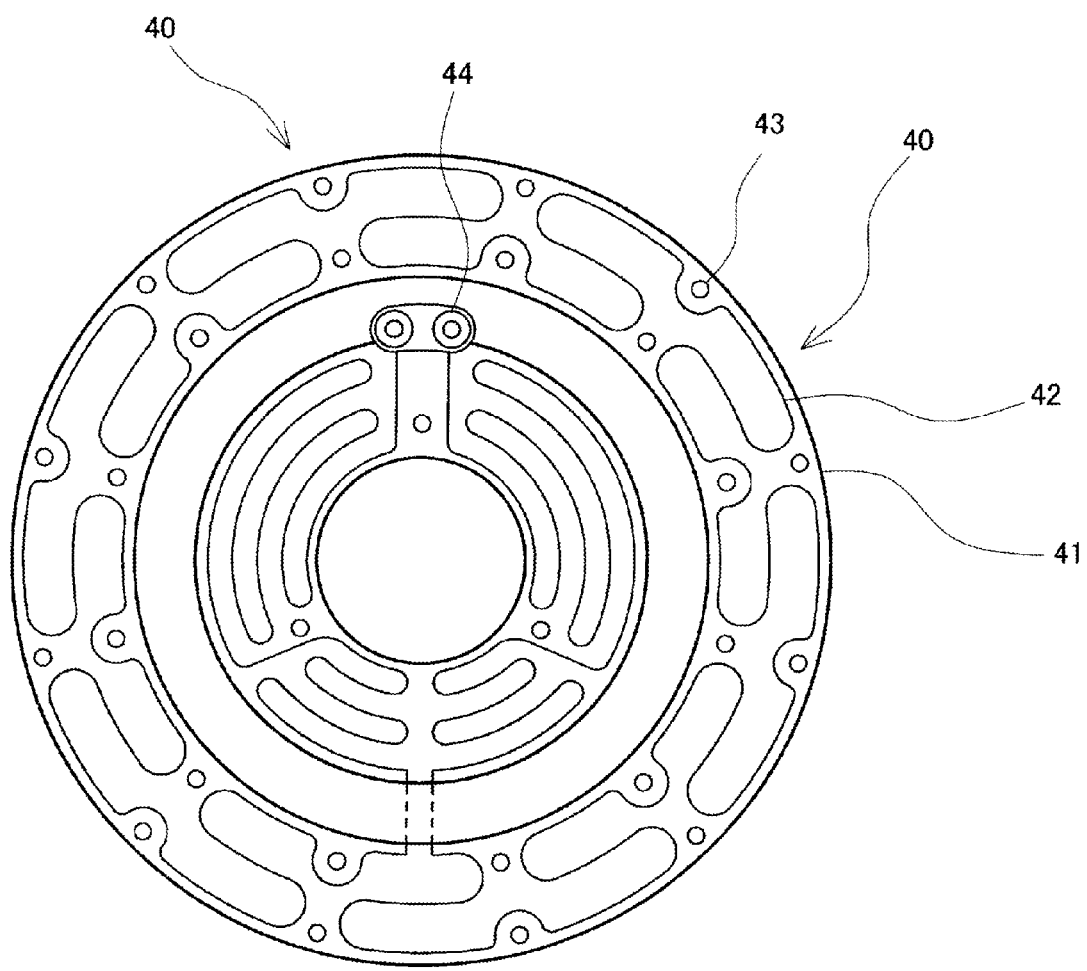
FIG. 3 is a plan view illustrating a heater of the bonding stage according to the embodiment of the present invention.

As illustrated in FIG. 3, the heater 40 configured by providing a resistance wire 42 on a surface of a disc-shaped mica plate 41 of substantially the same size as the rigid block 10 illustrated in FIG. 1. The mica plate 41 is provided with a plurality of holes 43 that penetrate through the mica plate 41. The holes 43 are disposed at the same positions as the projections 11 of the rigid block 10 illustrated in FIG. 1 and FIG. 2, in which holes the projections 11 penetrate through respectively. Further, the heater retainer plate 45 illustrated in FIG. 1 is a circular plate that is substantially the same size as the heater 40, and provided with the holes 43 through which the projections 11 respectively penetrate at the same positions as those of the projections 11. Therefore, the heater 40 and the heater retainer plate 45 are configured to be movable along the projections 11 in the thickness direction of the rigid block 10. Moreover, the resistance wire 42 of the heater 40 is provided with a power input terminal 44.

The flat plate 20 is in the same disc shape as the rigid block 10, as described previously, flatness of the lower surface 26 in contact with the supporting surface 18 of the upper surface of each of the projections 11 of the rigid block 10 is ensured by machining, so that the flat plate 20 is flatly supported by the supporting surface 18. Further, an upper surface 25 of the flat plate 20 is machined so as to ensure parallelism with the lower surface 26. As illustrated in FIG. 1, the upper surface 25 of the flat plate 20 is provided with a suction groove 22 for suctioning and fixing a lower surface 31 of the ceramic plate 30, and an upper surface 32 of the ceramic plate 30 is provided with a suction groove 33 for suctioning and fixing a wafer that is not illustrated. Moreover, as illustrated in FIG. 1, an annular retainer ring 60 is provided along a rim of the flat plate 20. By screwing bolts 61 into the rigid block 10, the retainer ring 60 holds and fixes the rim of the flat plate 20 between the retainer ring 60 and the rigid block 10.

The bonding stage 100 illustrated in FIG. 1 is assembled by: first placing the rigid block 10 on a platen, for example; disposing the coil springs 50 in the respective bottomed holes 17 of the rigid block 10; fitting the holes 43 in the heater retainer plate 45 and the heater 40 respectively around the projections 11 of the rigid block 10; and bringing the coil springs 50 into contact with the lower surface of the heater retainer plate 45. Thereafter, the positions of the thread holes 21 in the flat plate 20 are aligned with the positions of the hole 14 of the rigid block 10, the supporting surfaces 18 of the upper surfaces of the projections 11 of the rigid block 10 are caused to support the flat plate 20, the bolts 15 are inserted into the bottomed holes 13 and the holes 14 from the lower surface of the rigid block 10, the bolts 15 are fastened, and whereby the rigid block 10 and the flat plate 20 are fixed. The initial height of the coil springs 50 is greater than the depth of the bottomed holes 17 arranged in the rigid block 10. Therefore, when the flat plate 20 is fixed to the rigid block 10, as the coil springs 50 are compressed, the heater retainer plate 45 and the heater 40 is pushed up (moved in the thickness direction of the rigid block 10) by a repulsive force of the coil springs 50, and the heater 40 is pressed onto and brought into close contact with the lower surface 26 of the flat plate 20 (the surface on the side of the rigid block 10). At this time, as a small gap is produced between the heater retainer plate 45 and the surface 16 of the rigid block 10, the heater 40 and the heater retainer plate 45 are not brought into close contact with the surface 16 of the rigid block 10. Then, the retainer ring 60 is placed along the rim of the upper surface 25 of the flat plate 20, and fixed by the bolts 61. Further, the power input terminal 44 of the heater is connected to a power source that is not illustrated. Finally, the bonding stage 100 is connected to a vacuum apparatus, and the upper surface 25 of the flat plate 20 is caused to suction the lower surface 31 of the ceramic plate 30. When using the bonding stage 100, the suction groove 33 provided in the upper surface of the ceramic plate 30 is made vacuum by the vacuum apparatus to suction a wafer on the upper surface, and power is supplied from the power source to the heater 40 to heat the flat plate 20.

As described above, as the supporting surfaces 18 of the projections 11 of the rigid block 10 are machined to be flush with each other, and flatness of the lower surface 26 of the flat plate 20 is ensured by machining, the lower surface 26 of the flat plate 20 is supported by the supporting surfaces 18 to be flush with each other. Further, as the upper surface 25 of the flat plate 20 is machined to ensure parallelism with the lower surface 26, the upper surface 25 of the flat plate 20 is provided with favorable flatness, as well as high rigidity given by the rigid block 10. Moreover, as the heater 40 is pressed onto the lower surface 26 of the flat plate 20 by the coil springs 50, it is possible to uniformly heat the lower surface 26 of the flat plate 20. With this, the bonding stage 100 of this embodiment is provided with high rigidity and high flatness, and capable of heating uniformly. Furthermore, in the bonding stage 100 of this embodiment, the heater 40 is not attached the ceramic plate 30 for suctioning a wafer, and the ceramic plate 30 is fixed to the upper surface 22 of the flat plate 20 by vacuum suctioning. Therefore, even if the surface 32 of the ceramic plate 30 is contaminated during bonding, it is possible to easily replace the ceramic plate 30, thus improving efficiency in maintenance. Further, in the bonding stage 100 of this embodiment, as the heater 40 is not fixed to the rigid block 10 or the flat plate 20, it is possible to easily replace the heater 40 even when the heater 40 goes out of order. Therefore, the bonding stage 100 of this embodiment has high maintainability. Moreover, in the bonding stage 100 of this embodiment, the heater 40 and the heater retainer plate 45 are not in close contact with the surface 16 of the rigid block 10, and a small gap is produced therebetween. Therefore, heat from the heater 40 is not easily transmitted to the surface 16 of the rigid block 10, and it is possible to maintain the temperature of the part under the surface 16 of the rigid block 10 low. It should be noted that while the coil springs 50 are used as the elastic body in this embodiment, the elastic body is not limited to the coil springs 50. For example, leaf springs can be used.

Figure 4:
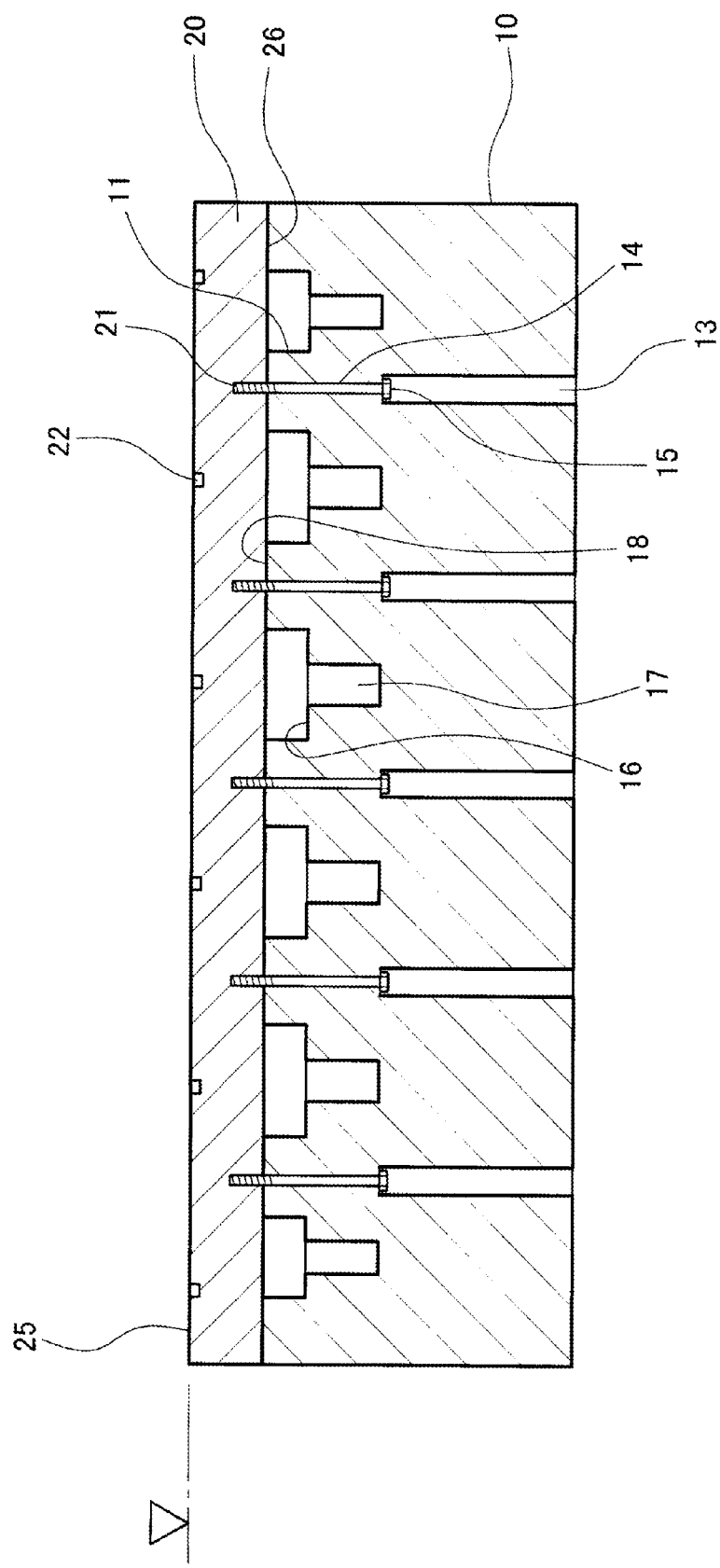
FIG. 4 is a schematic diagram illustrating a cross-section of the bonding stage in a temporary assembled state according to an embodiment of the present invention.

Next, as illustrated in FIG. 4, an embodiment in which machining (flattening) of the upper surface 25 of the flat plate 20 is performed in a temporary assembled state in which the flat plate 20 and the rigid block 10 are fixed by the bolts 15 (flat plate fixation step) will be described. Similarly to the embodiment previously described with reference to FIG. 1 through FIG. 3, the supporting surfaces 18 of the projections 11 of the rigid block 10 are machined to be flush with each other, and flatness of the lower surface 26 of the flat plate 20 is also ensured by machining. Therefore, the lower surface 26 of the flat plate 20 is flatly supported by the supporting surfaces 18 to be flush with each other. As illustrated in FIG. 4, by performing machining of the upper surface 25 of the flat plate 20 (flattening step) in this state, flatness of the upper surface 25 of the flat plate 20 with respect to the rigid block 10 can be further ensured. Moreover, by performing flattening in the temporary assembled state, it is possible to prevent flatness from being deteriorated due to accumulation of minor distortion of the components after the assembly, and thus to even further improve flatness.

Upon completion of machining of the upper surface 25 of the flat plate 20, the bolt 15 is removed to separate the rigid block 10 from the flat plate 20 (flat plate removal step), the coil springs 50 are inserted into the bottomed holes 17 in the rigid block 10, the holes 43 in the heater retainer plate 45 and the heater 40 are fitted respectively around the projections 11 of the rigid block 10 (heater arrangement step), fixing the flat plate 20 to the rigid block 10 again by the bolts 15, and the heater 40 is pressed onto and brought into close contact with the lower surface 26 of the flat plate 20 by a biasing force of the coil springs 50 (flat plate re-fixation step).

Similarly to the embodiment described previously, the bonding stage of this embodiment is provided with a simple structure, high rigidity, high flatness, capability of uniform heating, and high maintainability.

The present invention is not limited to the embodiments described above, and can include any alterations and modifications without departing from the technical scope and the spirit of the present invention as defined in the appended claims.

REFERENCE SIGNS LIST

10: Rigid Block
11: Projection
13, 17: Bottomed Hole
15: Bolt
16: Surface
18: Supporting Surface
20: Flat Plate
21: Thread Hole
22, 33: Suction Groove
25, 32: Upper Surface
26, 31: Lower Surface
30: Ceramic Plate
40: Heater
41: Mica Plate
42: Resistance Wire
43: Hole
44: Power Input Terminal
45: Heater Retainer Plate
50: Coil Spring
60: Retainer Ring
61: Bolt
100: Bonding Stage

The invention claimed is:

1. A bonding stage comprising:
a base body having a plurality of projections on a surface of the base body, upper surfaces of the projections being flat;
a flat plate fixed to the upper surfaces of the projections;
a surface plate suctioned and fixed to the flat plate;
a plate-shaped heater disposed on a side of the base body of the flat plate; and
elastic members disposed between the heater and the base body, the elastic members bringing the heater into close contact with a surface of the flat plate on the side of the base body,
wherein the base body comprises a plurality of bottomed holes, the elastic members are respectively disposed in the bottomed holes, and an initial height of the elastic members is greater than a depth of the bottomed holes, the heater comprises a plurality of holes through which the projections penetrate, and is movable along the projections in a thickness direction of the base body, and the elastic members are compressed when the flat plate is fixed to the upper surfaces of the projections of the base body, and press the heater onto the flat plate to bring the heater into close contact with the flat plate.

2. A method of manufacturing a bonding stage, the method comprising:

a step of preparing a base body, a flat plate and a surface plate, a plate-shaped heater, elastic members, the base body having a plurality of projections on a surface of the base body, upper surfaces of the projections being flat, the flat plate being fixed to the upper surfaces of the projections, the surface plate being suctioned and fixed to the flat plate, a flat plate fixation step of fixing the flat plate to the upper surfaces of the projections; a flattening step of flattening a surface of the flat plate while treating the base body and the flat plate as a single unit;

a flat plate removal step of removing the flat plate from the base body after the flattening step;

a heater arrangement step of arranging the plate-shaped heater and the elastic members between the heater and the base body; and a flat plate re-fixation step of fix the flat plate to the base body again such that the flat plate is fixed to the upper surfaces of the projections, and that the heater is brought into close contact with the surface of the flat plate on a side of the base body, wherein the base body comprises a plurality of bottomed holes, the elastic members are respectively disposed in the bottomed holes, and an initial height of the elastic members is greater than a depth of the bottomed holes, the heater comprises a plurality of holes through which the projections penetrate, and is movable along the projections in a thickness direction of the base body, and the elastic members are compressed when the flat plate is fixed to the upper surfaces of the projections of the base body, and press the heater onto the flat plate to bring the heater into close contact with the flat plate.

* * * * *